United States Patent
Prior et al.

(10) Patent No.: US 11,528,002 B2
(45) Date of Patent: *Dec. 13, 2022

(54) SYSTEMS, APPARATUS AND METHODS FOR DYNAMIC RANGE ENHANCEMENT OF AUDIO SIGNALS

(71) Applicant: Cirrus Logic International Semiconductor Ltd., Edinburgh (GB)

(72) Inventors: Morgan Timothy Prior, Edinburgh (GB); Pradeep Saminathan, Edinburgh (GB); Mehul Mistry, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/349,638

(22) Filed: Jun. 16, 2021

(65) Prior Publication Data
US 2021/0313944 A1 Oct. 7, 2021

Related U.S. Application Data

(63) Continuation of application No. 16/835,679, filed on Mar. 31, 2020, now Pat. No. 11,070,183.

(51) Int. Cl.
*H03G 3/30* (2006.01)
*G10L 25/51* (2013.01)
*H04R 3/00* (2006.01)

(52) U.S. Cl.
CPC ........... *H03G 3/3005* (2013.01); *G10L 25/51* (2013.01); *H04R 3/00* (2013.01); *H03G 2201/103* (2013.01); *H04R 2430/01* (2013.01)

(58) Field of Classification Search
CPC ............ H03G 3/3005; H03G 2201/103; G10L 25/51; H04R 3/00; H04R 2430/01
(Continued)

(56) References Cited

U.S. PATENT DOCUMENTS

2003/0081796 A1  5/2003  Bray et al.
2008/0123873 A1  5/2008  Bjorn-Josefsen et al.
(Continued)

FOREIGN PATENT DOCUMENTS

CA    2840730 A1    11/2016
CN    202095090 U   12/2011
(Continued)

OTHER PUBLICATIONS

International Search Report and Written Opinion of the International Searching Authority, International Application No. PCT/GB2018/051424, dated Jul. 16, 2018.
(Continued)

*Primary Examiner* — Paul Kim
(74) *Attorney, Agent, or Firm* — Jackson Walker L.L.P.

(57) ABSTRACT

An apparatus for providing an output signal to an audio transducer comprises: one or more signal paths for receiving respective digital audio input signals, applying respective digital gains, and outputting respective amplified digital audio input signals; one or more inputs for receiving one or more volume parameters associated with the digital audio input signals; converter circuitry, coupled to the one or more signal paths, for converting the one or more amplified digital audio input signals into the analogue domain, and outputting an analogue audio input signal; an analogue gain element, for applying an analogue gain to the analogue audio input signal and outputting the output signal; and a control circuit, coupled to the one or more signal paths, operative to select the analogue gain based on a comparison of the volume parameters and the one or more digital audio input signals as multiplied by the volume parameters, and to select the respective digital gains for each digital audio input signal so that an overall gain in the respective signal path corresponds
(Continued)

to a volume parameter associated with the respective digital audio input signal.

20 Claims, 5 Drawing Sheets

(58) Field of Classification Search
USPC .......................................................... 381/104
See application file for complete search history.

(56) References Cited

U.S. PATENT DOCUMENTS

| | | |
|---|---|---|
| 2009/0220110 A1 | 9/2009 | Bazarjani et al. |
| 2012/0188111 A1 | 7/2012 | Ledzius et al. |
| 2013/0106635 A1 | 5/2013 | Doi |
| 2013/0156207 A1 | 6/2013 | Visser et al. |
| 2014/0334643 A1 | 11/2014 | Pinna et al. |
| 2015/0237432 A1 | 8/2015 | Miluzzi et al. |
| 2015/0249466 A1 | 9/2015 | Elyada |
| 2015/0289054 A1 | 10/2015 | Sakai |
| 2016/0080862 A1 | 3/2016 | He et al. |
| 2017/0242652 A1 | 8/2017 | Park et al. |
| 2018/0352328 A1* | 12/2018 | Morgan ............... H03G 3/3005 |

FOREIGN PATENT DOCUMENTS

| | | |
|---|---|---|
| CN | 102611449 A | 7/2012 |
| CN | 102983816 A | 3/2013 |
| CN | 103138695 A | 6/2013 |
| CN | 106063124 A | 10/2016 |
| GB | 2527677 A | 12/2015 |
| WO | 2014160542 A2 | 10/2014 |
| WO | 2016040171 A2 | 3/2016 |

OTHER PUBLICATIONS

Combined Search and Examination Report, UKIPO, Application No. GB1711583.3, dated Jan. 22, 2018.
Office Action, China National Intellectual Property Administration, CN Application No. 201880037481.X, dated Apr. 26, 2020, no translation available.

* cited by examiner

SYSTEMS, APPARATUS AND METHODS FOR DYNAMIC RANGE ENHANCEMENT OF AUDIO SIGNALS The present disclosure is a continuation of U.S. Non-Provisional patent application Ser. No. 16/835,679, filed Mar. 31, 2020, which is incorporated by reference herein in its entirety.

TECHNICAL FIELD

Examples of the present disclosure relate to the provision of audio signals to an audio transducer, and particularly to systems, apparatus and methods using dynamic range enhancement for the provision of audio signals to an audio transducer.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of the amplifier, such that any increased dynamic range as a result of a high-gain amplifier may be offset by signal noise which may effectively mask lower-intensity audio signals.

Dynamic range enhancement (DRE) is a technique to mitigate these issues. DRE is a three-stage process. In a first stage, digital gain is applied to an input digital signal; in a second stage, the digital signal is converted to the analogue domain by converter circuitry; and, in the third stage, an analogue gain is applied to the analogue signal. The digital gain may be determined dynamically, based on the amplitude of the input digital signal, and configured so as to increase the size of the digital signal at the input to the converter circuitry. In this way, the converter circuitry operates on a larger signal and as a result converts the signal to the analogue domain with lower noise. The analogue gain is configured to compensate for the digital gain, so that overall the signal passing through the signal path is amplified to the required level, in spite of the dynamically changing digital gain. Thus, DRE can be used to increase the dynamic range of an audio signal.

SUMMARY

As noted above, the digital and analogue gains in a dynamic range enhancement process are determined based on the amplitude of the input signal. Where the input signal is subject to a separate path gain (e.g., based on a volume parameter), the digital and analogue gains are determined based on a combination of the input signal and the signal path, i.e. path, gain. That is, the amplitude of the input signal as altered by the path gain is estimated and the digital and analogue gain values selected based on this amplitude.

The digital and analogue gains are typically quantized values, selected from a plurality of possible quantized values. The ideal value of the digital and analogue gains, calculated based on the estimated amplitude, will typically fall between their possible quantized values. Thus, selection of the digital and analogue gains will involve rounding up or rounding down from the ideal values to one of the quantized values.

In practice, to avoid the possibility of clipping (where the amplifier is overdriven by an input signal which exceeds its maximum capability), the ideal gain is always rounded up to the next quantized value. However, this can have unintended negative consequences.

In particular, where the input signal has an amplitude which is close to full scale, the combination of the input signal and the path gain can result in an overestimation of the analogue gain value. For example, say the amplitude of the input signal is full scale and the path gain is also set to a maximum value. An overestimation (or a rounding error) in the combination of the input signal and the path gain may result in an analogue gain value being selected which raises the noise floor in the amplified signal output by the analogue gain element of the system, and thus reduces performance.

According to one aspect of the disclosure, there is provided an apparatus for providing an output signal to an audio transducer, comprising: one or more signal paths for receiving respective digital audio input signals, applying respective digital gains, and outputting respective amplified digital audio input signals; one or more inputs for receiving one or more volume parameters associated with the digital audio input signals; converter circuitry, coupled to the one or more signal paths, for converting the one or more amplified digital audio input signals into the analogue domain, and outputting an analogue audio input signal; an analogue gain element, for applying an analogue gain to the analogue audio input signal and outputting the output signal; and a control circuit, coupled to the one or more signal paths, operative to select the analogue gain based on a comparison of the volume parameters and the one or more digital audio input signals as multiplied by the volume parameters, and to select the respective digital gains for each digital audio input signal so that an overall gain in the respective signal path corresponds to a volume parameter associated with the respective digital audio input signal.

In a further aspect, the disclosure provides an electronic device comprising an apparatus as recited above.

Another aspect provides a method for providing an output signal to an audio transducer, comprising: receiving one or more digital audio input signals, applying respective digital gains, and outputting respective amplified digital audio input signals; receiving one or more volume parameters associated with the digital audio input signals; converting the one or more amplified digital audio input signals into the analogue domain, and outputting an analogue audio input signal; and applying an analogue gain to the analogue audio input signal and outputting the output signal. The analogue gain is determined based on a comparison of the volume parameters and the one or more digital audio input signals as multiplied by the volume parameters. The respective digital gains for each digital audio input signal are determined so that an overall gain in the respective signal path corresponds to a volume parameter associated with the respective digital audio input signal.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
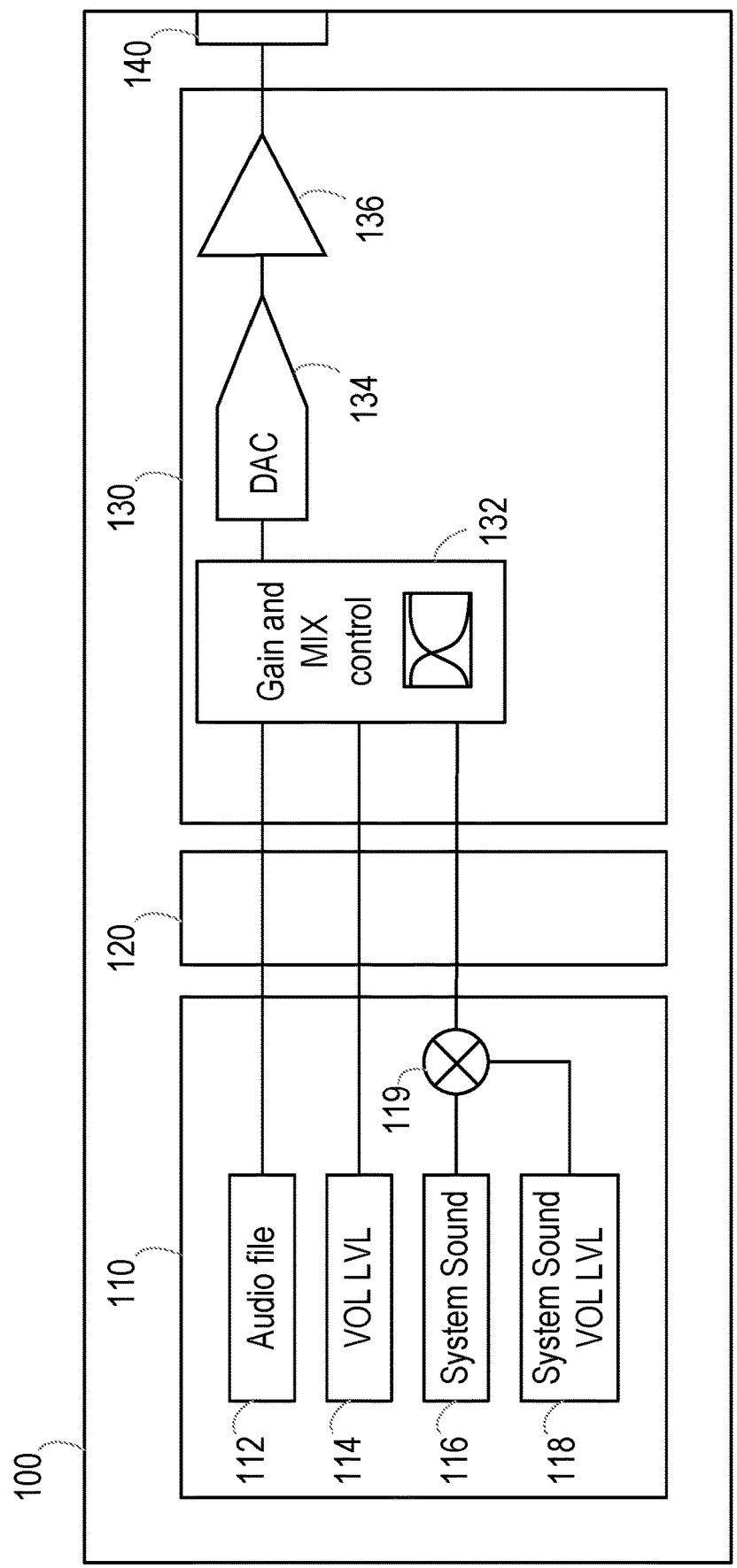
FIG. 1 shows an electronic device according to embodiments of the disclosure.

FIG. 1 shows an electronic device 100 according to embodiments of the disclosure. The device 100 is operable to provide high-fidelity playback of audio, such as music, to a user of the device. In addition, the device may generate so-called "system sounds", e.g., audio signals generated by an operating system or other software running on the device, responsive to detection of an event (e.g. an incoming message or call, an alarm, etc), or user input (e.g. button or key clicks, interaction with a game, etc). The electronic device may therefore comprise one or more of: a portable device; a battery-powered device; a communications device; a computing device; a mobile telephone; a laptop, notebook or tablet computer; a personal media player; a gaming device; and a wearable device.

The device 100 comprises processor circuitry 110, internal interface circuitry 120, an audio codec 130 and external interface circuitry 140. In general terms, according to the illustrated embodiment, multiple digital audio signals (as well as at least one volume parameter) are output from the processor circuitry 110, to the codec 130, via the internal interface circuitry 120. In the codec 130, the digital audio signals are processed, converted to the analogue domain, and amplified by a power amplifier. The detailed operation of the codec 130 is described below. The amplified signals are then output from the codec 130 and passed to the external interface circuitry 140 to be output from the device 100 to the user.

In the illustrated embodiment, the processing circuitry 110 and the codec 130 are each provided on separate integrated circuits (thus requiring internal interface circuitry 120 to effect the transfer of data from one to the other). In other embodiments, the functions of the codec 130 (described below) may be provided within the AP 110 itself, i.e. on the same integrated circuit.

The processor circuitry 110 may comprise any suitable processor or processor circuitry for running the electronic device 100 and the applications provided by it. For example, in one embodiment, the processor circuitry 110 may run an operating system and/or other applications provided by the electronic device. Such processor circuitry may be known as an applications processor (AP), and the processing circuitry 110 may also be termed the AP 110 herein.

The AP 110 is operative to output one or more digital audio signals. The AP 110 may also output one or more volume signals associated with one or more of the digital audio signals.

At least one of the digital audio signals (e.g. a digital signal corresponding to music) may require high-fidelity output. Thus, in the illustrated embodiment, an audio file 112 (which may correspond to a music file) provides a first digital audio signal. A first volume parameter 114 is also provided by the AP 110, and is associated with the audio file 112 in that the first volume parameter is to be applied to the audio file before output to a user. For example, the first volume parameter may be written in a register within or accessible by the AP 110. The first volume parameter may be set based on some user input. For example, the user may specify the volume of music to be played from a particular application (e.g. through interaction with the application or configuration settings associated with the application), or from the device 100 in general (e.g. through interaction with the operating system or physical volume controls in the electronic device 100 or a peripheral device coupled to it).

Some embodiments of the disclosure provide for combined amplification of a plurality of audio signals. Thus, in these embodiments, the AP 110 outputs a plurality of digital audio signals. At least one other signal of the plurality of digital audio signals may relate to system sounds 116, generated within the operating system or other software responsive to detection of an event (e.g. an incoming message or call, an alarm, etc), or user input (e.g. button or key clicks, interaction with a game, etc). System sounds are generally shorter than music and therefore, relative to playback of the audio file 112, the system sounds 116 can be considered intermittent. It will be noted that the fidelity of system sounds can generally be lower than that associated with music playback.

The system sounds 116 may also be associated with a volume parameter (termed herein, "the second volume parameter") 118. Again, the second volume parameter may be written in a register within or accessible by the AP 110, for example. The second volume parameter may be set based on user input or hard-coded into the operating system. In the former case, for example, the user may specify the volume of system sounds to be played from a particular application or from the operating system in general (e.g. through interaction with the application or configuration settings associated with the application, or through interaction with the operating system or configuration settings associated with the operating system). In the latter case, the volume of system sounds may be placed beyond the user's control.

The second volume parameter 118 may also be provided to the codec 130 (and indeed FIG. 3 below describes such an embodiment). However, in the embodiment illustrated in FIG. 1 (and also in FIG. 2 below), the second volume parameter 118 is applied to the system sound audio signal in a gain element 119 within the AP 110. Thus, the output of the gain element 119 is a digital audio signal, corresponding to the system sounds, to which a volume parameter has already been applied.

It will further be understood by those skilled in the art that, although FIG. 1 shows a single system sounds module 116 (i.e. from which all system sounds are output), the various system sounds generated may be output separately from the AP 110. A volume parameter may be associated with a single system sound (i.e. a one-to-one mapping between volume parameters and system sounds), a group of system sounds (i.e. a one-to-many mapping between volume parameters and system sounds) or all system sounds. In some embodiments, no volume parameter may be provided for the system sounds, which are instead generated at the required volume ab initio.

Thus, in some embodiments, one or more digital audio signals may be output from the AP 110 to the codec 130. The audio signals may be associated with volume parameters or not.

The internal interface circuitry 120 may be any interface, bus or other circuitry suitable for passing signals from one component of the device 100 to another and may implement any suitable data transfer protocol. For example, the interface circuitry 120 may implement the I²S interface standard, and transfer pulse code modulated (PCM) signals or direct stream digital (DSD) signals between the AP 110 and the codec 130. However, alternative interface standards and encoding mechanisms may be used without departing from the scope of the claims appended hereto. Those skilled in the art will realise that the disclosures herein are not limited in that respect.

As noted above, the codec 130 is operative to receive the digital audio signals from the AP 110, convert those digital audio signals to the analogue domain, apply an analogue gain, and output the analogue signals (with applied gain). Detailed operation of the codec 130 is described below. However, in general terms the digital audio signal 112, the first volume parameter 114 and the output of the gain element 119 are provided to gain and mix control circuitry (hereinafter, "control circuitry") 132 within the codec 130. The control circuitry 132 is operative to apply one or more digital gains to the respective audio signals, and to combine the audio signals once the digital gain has been applied (in embodiments relating to amplification of a plurality of audio signals). The amplified digital audio signal is then provided to a digital-to-analogue converter (DAC) 134, which converts the signal to the analogue domain, and the analogue signal is provided to a power amplifier 136 for application of an analogue gain.

The control circuitry 132 is also operative to set the analogue gain in the power amplifier 136. For example, according to embodiments of the disclosure, the control circuitry 132 is operable to select the analogue gain based on a combination of the digital audio signals output from the AP 110, optionally after application of any volume parameter associated with those signals (such as the first volume parameter 114). The digital gains applied to the digital signals may be set based on any volume parameter associated with the digital signal and received by the codec 130, adapted so as to compensate for the analogue gain applied in the power amplifier 136.

The technical effect of this is to increase the dynamic range of the amplifier 136. In embodiments relating to amplification of a plurality of audio signals, the technical effect is to dynamically and automatically trade-off the dynamic range of the audio file when a system sound is generated so as to improve the noise performance of the amplifier 136 in those circumstances. Further detail regarding this aspect is provided below with respect to FIG. 3.

Thus, the codec 130 outputs an amplified analogue audio signal. In the illustrated embodiment, the analogue audio signal is output to external interface circuitry 140. For example, one or more speakers, or a set of headphones, or in general one or more audio transducers, may be coupled to the external interface circuitry 140. The external interface circuitry 140 may therefore comprise an audio plug, into which an audio jack (such as a 3.5 mm jack) or any other suitable connector (such as a Lightning® connector, USB connector, etc) can be inserted.

It will further be understood that the audio transducer or transducers may be provided within the electronic device itself (although this embodiment is not illustrated). In such an arrangement, the analogue signal may be provided from the codec 130 directly to the one or more audio transducers for playback to the user.

Figure 2:
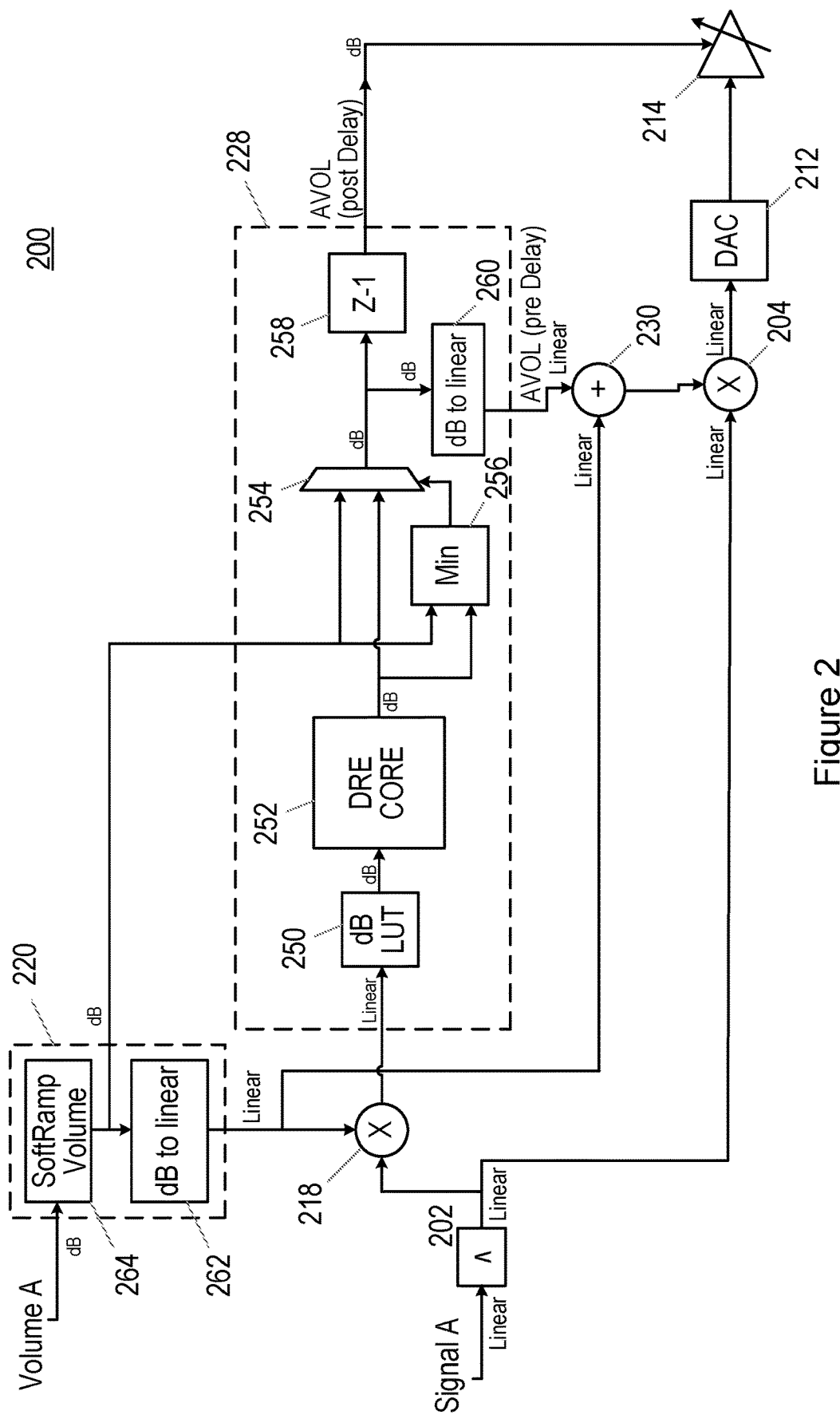
FIG. 2 shows codec circuitry according to embodiments of the disclosure.

FIG. 2 illustrates apparatus 200 according to embodiments of the disclosure. For example, the apparatus 200 may be suitable to provide the functions of the codec 130 described above with respect to FIG. 1. The embodiment of FIG. 2 shows amplification of a single audio signal, referred to as "SignalA". For example, SignalA may correspond to the audio, or music file 112, system sounds 116, the output of gain element 119, a voice signal, or any combination thereof.

FIG. 2 further shows the application of a volume parameter for SignalA denoted VolumeA.

SignalA (which is a digital audio signal) is provided on a first signal path to a first upsampling unit 202. The upsampling unit 202 upsamples the signal according to a clock signal provided to it (not shown). For example, the signal may be upsampled from a conventional sampling frequency for audio of 48 kHz or 192 kHz, to a higher frequency of 1.4 MHz or greater. The higher sampling frequency enables changes to the digital and analogue gains (described below) to be closely matched in the time domain, so as to avoid "pops", "clicks" and other unwanted artefacts which may be audible to the user.

The upsampled signal is provided to a first digital gain element 204, where a digital gain is applied.

The output of the first digital gain element 204 is provided to digital-to-analogue converter (DAC) circuitry 212, which converts the digital signal to the analogue domain. Those skilled in the art will be familiar with many different processes and circuits which can perform this DAC function, and the DAC circuitry 212 is not described further herein.

The output of the DAC circuitry 212 (which is an analogue audio signal) is provided to a power amplifier 214. The power amplifier 214 applies an analogue gain to the signal, and outputs an amplified analogue signal to an output 216. The analogue gain is typically an attenuation of the signal. As noted above, the amplified analogue signal may be provided to an audio transducer, either within the same electronic device as the apparatus 200 or coupled to that device.

Thus, a digital gain is applied to SignalA, before the signal is converted to the analogue domain. An analogue gain is applied to the analogue signal, which is then output from the apparatus 200.

In order to determine the digital gain and the analogue gain, the apparatus comprises control circuitry operable to provide control signals to the digital gain element 204 and the power amplifier 214 to control and set the gains to be applied in those elements.

The control circuitry comprises a further digital gain element 218, which is coupled to the output of the upsampler 202 to receive the upsampled version of SignalA. The digital gain element 218 applies a gain to the signal which is based on the volume parameter VolumeA.

Those skilled in the art will appreciate that VolumeA and other gain factors are often defined in terms of a logarithmic ratio (such as decibels) between an input signal and a desired output signal. For example, the gain factor may define logarithmically the ratio between a full-scale input signal and a desired output signal (which may have a smaller amplitude). For example, when defined in terms of decibels, a gain factor of minus six (−6 dB) may be approximately equal to a multiplication factor of 0.5. The application of those logarithmic gain factors may be effected in the digital gain element 218 and other gain elements by use of a suitable converter on the gain operand, to convert the logarithmic value to a linear gain value, prior to the multiplication of the linear gain value with the signal. This is conventional and will be well understood by those skilled in the art. Thus, in the illustrated embodiment, each of the digital gain elements 204 and 218 may comprise a suitable converter for converting the logarithmic gain factor (i.e. defined in terms of dBs) to a linear equivalent value (see for example the converters 260, 262 described below).

It will be further understood that the volume parameters and gain factors may also be defined in terms of the direct multiplication factor to be applied to the signals in question, with suitable amendments to the circuitry to account for the formal change.

The gain factor applied in the digital gain element 218 may further be adapted by a softramp control circuitry 220. The softramp control circuitry 220 may adapt the volume parameter VolumeA (which may be received from the AP 110, see above) so as to smooth transitions between different values of the volume parameter and avoid unwanted audio artefacts caused by any abrupt change in the volume.

In the illustrated embodiment, the softramp control circuitry 220 comprises a softramp control module, which receives VolumeA (in dB) and adapts it so as to smooth transitions between different values as noted above. The softramp control circuitry 220 further comprises a dB to linear converter module, which converts the output of the softramp control module from dB to a linear multiplication value to be applied in the digital gain element 218.

The output of the gain element 218, which is equal to SignalA*VolumeA (subject to smoothing by the softramp control module), is provided to DRE circuitry 228.

According to embodiments of the disclosure, the DRE circuitry 228 is operative to provide an analogue gain parameter AVOL to the power amplifier 214. In one embodiment, the analogue gain parameter is based on the output of the digital gain element 218, i.e. SignalA*VolumeA.

In more detail, the DRE circuitry 228 comprises converter circuitry 250 for converting the linear output of the digital gain element 218 to dB. In the illustrated embodiment, the converter circuitry comprises a look-up table (LUT) between the linear values and corresponding dB values, but those skilled in the art will be well aware of alternative conversion mechanisms and the present disclosure is not limited in that regard.

The output of the converter circuitry is provided to a DRE core module 252, which performs one or more functions based on the output of the converter circuitry, and outputs an analogue gain parameter. For example, the DRE core module 252 may apply one or more filters to the output of the converter circuitry 250 so as to condition the signal to achieve a desired effect. The filters may comprise a low-pass filter, designed to smooth the signal by filtering out high-frequency components, for example. The DRE core module 252 may additionally or alternatively detect an envelope of the output of the converter circuitry 250, SignalA*VolumeA, and output the envelope as the analogue gain parameter. The output of the DRE core module 252 (whether corresponding to the filtered output of the converter circuitry 250 and/or the envelope of that output) may be subject to one or more additional operations, such as the addition of an offset to provide a fixed amount of padding or headroom to account for any underestimation in the output.

According to the principles of dynamic range enhancement, the analogue gain parameter output by the DRE core module 252 would be provided to the power amplifier 214 for use as the analogue gain to be applied to the output of the DAC circuitry 212. The analogue gain parameter would also be combined with VolumeA (e.g., through subtraction of the analogue gain parameter from VolumeA), to determine the digital gain to be applied in the digital gain element 204.

However, as noted above, this arrangement has the disadvantage of raising the noise floor in certain circumstances, where SignalA or its combination with VolumeA are overestimated. For example, quantization error may be introduced in any of the dB-to-linear or linear-to-dB convertor mechanisms 250, 262, or in the detection of the envelope in the DRE core 252. This can result in the analogue gain parameter exceeding the path gain (VolumeA), raising the noise floor and reducing performance.

In order to address this problem, according to embodiments of the disclosure the DRE circuitry 228 additionally comprises limiter circuitry configured to limit the analogue gain parameter to whichever is smaller of the output of the DRE core module (e.g., SignalA*VolumeA) and the path gain (e.g., VolumeA). In this way, the analogue gain is constrained never to exceed the path gain, maintaining an optimal noise floor for full-scale input signals and preventing underestimation of the input signal at all amplitudes.

In the illustrated embodiment, the limiter circuitry comprises a selector module 254 which is configured to receive as inputs the output of the DRE core module 252 (e.g., SignalA*VolumeA) and the path gain from the softramp control module 264 (e.g., VolumeA). The DRE circuitry 228 further comprises a minimum detection module 256, which is also configured to receive as inputs the output of the DRE core module 252 (e.g., SignalA*VolumeA) and the path gain from the softramp control module 264 (e.g., VolumeA), and to determine which is smaller. The minimum detection module 256 outputs a control signal to the selector module 254, indicative of the smaller signal, and the selector module 254 is then operative to output the smaller signal as the analogue gain parameter.

The analogue gain parameter (AVOL) is provided to the power amplifier 214 for application as the analogue gain to the output of the DAC circuitry 212. The analogue gain parameter may be subject to a delay (e.g., in a delay unit 258 as shown in FIG. 2), to account for delay in the DAC circuitry 212, such that a particular value of the analogue gain is applied to a signal on the digital components of which the analogue gain was determined.

The analogue gain parameter is also provided to a combining element 230 to be used in determining the digital gain to be applied in the digital gain element 204. The analogue gain AVOL so provided may not be subject to the same delay applied to the analogue gain AVOL provided to the power amplifier 214, as the digital gains are applied prior to the processing in DAC circuitry 212.

Further, the analogue gain parameter is linear in some embodiments. When provided to the combining element 230, however, the quantity may be converted back to a logarithmic equivalent (i.e. dBs) in dB-to-linear convertor circuitry 260.

The combining element 230 thus receives the volume parameter VolumeA (or the output of the softramp control module 220), the analogue gain from DRE circuitry 228, and outputs a signal equal to the difference, e.g., VolumeA−AVOL. So, for example, if VolumeA is −6 dB, and AVOL is −1 dB, then the digital gain factor applied in combining element 330 is −5 dB.

The output of the combining element 230 is the digital gain factor to be applied to SignalA. Thus, the output of combining element 230 is provided to digital gain element 204, and a digital gain factor equal to VolumeA−AVOL is applied to SignalA.

It will be noted that the analogue gain applied in the power amplifier 214 (i.e. to the combination of audio signals) is thus effectively compensated for by corresponding alterations in the digital gains applied to each signal individually. The net effect of this circuitry is that SignalA is preserved when it is the sole audio signal, maximizing the dynamic range of the amplifier 214 using an analogue volume. Further, by limiting the analogue gain to the minimum of the path gain and the output of the digital gain element 218, an optimal noise floor is maintained for full-scale input signals without causing underestimation of the input signal at other amplitudes.

The circuitry of FIG. 2 thus shows the application of dynamic range enhancement to a signal audio signal according to embodiments of the disclosure. High-quality audio playback is clearly a desirable feature for personal audio devices. However, such devices are becoming increasingly multi-functional, such that audio playback is only one of several functions which may be provided simultaneously by the device. For example, in a typical operating system there may be a variety of audio streams which can be classified into two groups: music (HiFi) and system sounds (keyclicks, alarms, ringtones). These different sounds must be mixed together into a single output audio stream.

It is therefore desirable to apply dynamic range enhancement also to combinations of multiple audio signals, each of which may be subject to their own respective volume parameters.

Figure 3:
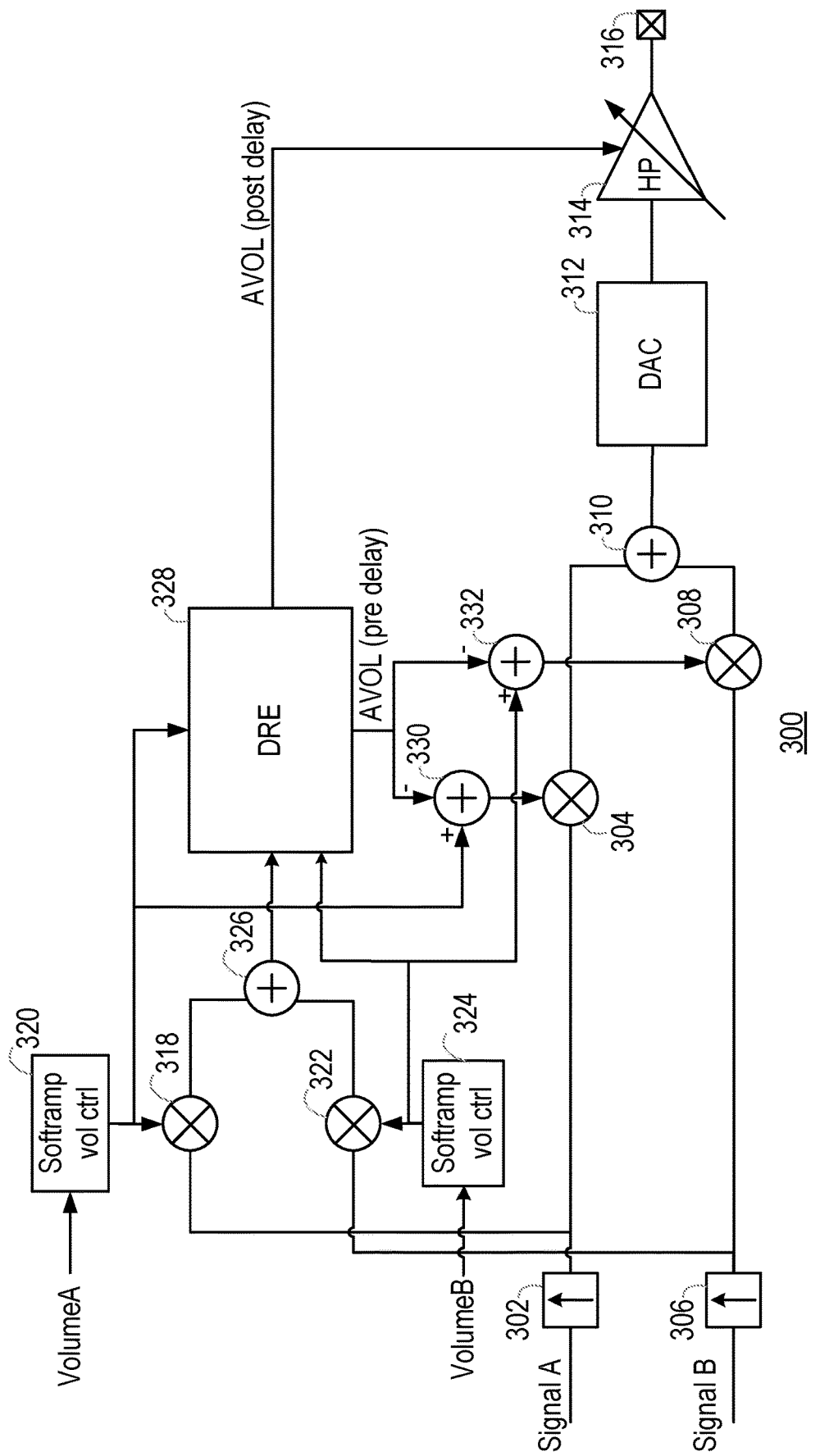
FIG. 3 shows codec circuitry according to further embodiments of the disclosure.

FIG. 3 illustrates an apparatus 300 according to embodiments of the disclosure in which multiple audio signals are combined. For example, the apparatus 300 may be suitable to provide the functions of the codec 130 described above with respect to FIG.

It will be apparent from the description below that the apparatus comprises a first signal path for receiving a first digital audio input signal, applying a first digital gain, and outputting an amplified first digital audio input signal, and a second signal path, for receiving a second digital audio input signal, applying a second digital gain, and outputting an amplified second digital audio input signal. Converter circuitry converts the amplified first and second digital audio input signals into the analogue domain, and outputs an analogue audio input signal, and an analogue gain element applies an analogue gain to the analogue audio input signal and outputting the output signal. The analogue gain is determined based on a combination of at least the first and second digital audio input signals or signals derived therefrom (such as where one or more of the first and second digital audio input signals is multiplied by a respective volume parameter). The first and second digital gains are selected so as to compensate for the analogue gain. In such a manner, dynamic range enhancement may be applied to the first digital audio input signal in the absence of the second digital audio input signal, while allowing for trade-off of the dynamic range when the second digital audio input signal is present.

Further, according to embodiments of the disclosure, the analogue gain is limited to the minimum of the combination of at least the first and second digital audio input signals or signals derived therefrom (such as where one or more of the first and second digital audio input signals is multiplied by a respective volume parameter), and the maximum path gain of at least the first and second signal paths. In other words, the analogue gain is limited to whichever is smaller of:
 the combination of at least the first and second digital audio input signals or signals derived therefrom; and
 a summation of all path gains (e.g., in the linear domain)

In FIG. 3, two signal paths are illustrated: "SignalA" (which may be taken to correspond substantially to the audio, or music file 112); "SignalB" (which may be taken to correspond substantially to system sounds 116, or the output of gain element 119, as described above). As noted above, however, more than two signal paths may be provided in order to combine more than two audio signals. For example, an audio signal may be provided comprising voice data. The concepts disclosed herein are not limited in that respect. In general herein, any two or more audio streams, of any frame rate and/or bit width, may be combined according to the principles disclosed herein.

Further, FIG. 3 shows the application of respective volume parameters for SignalA and SignalB, denoted VolumeA and VolumeB. However, in some embodiments, only one volume parameter (i.e. for one of the signals) may be provided to the apparatus. For example, FIG. 2 illustrates an embodiment in which a volume is applied to an audio signal within the AP 210, i.e. outside the codec 230 and the apparatus 300. In that case, the VolumeB parameter of FIG. 3 may be ignored.

Thus SignalA (which is a digital audio signal and may be representative of music or some other signal requiring high-fidelity output) is provided on a first signal path to a first upsampling unit 302. The upsampling unit 302 upsamples the signal according to a clock signal provided to it (not shown). For example, the signal may be upsampled from a conventional sampling frequency for audio of 48 kHz or 192 kHz, to a higher frequency of 1.4 MHz or greater. The higher sampling frequency enables changes to the digital and analogue gains (described below) to be closely matched in the time domain, so as to avoid "pops", "clicks" and other unwanted artefacts which may be audible to the user. The upsampled signal is provided to a first digital gain element 304, where a first digital gain is applied.

Similarly, SignalB (which is a digital audio signal, and may be representative of system sounds or some other signal not requiring high-fidelity output) is provided on a second signal path to a second upsampling unit 306. The upsampling unit 306 upsamples the signal in a similar manner to the upsampling unit 302, and the upsampled signal is provided to a second digital gain element 308, where a second digital gain is applied.

The outputs of the first and second digital gain elements 304, 308 are summed in a summing element 310, and provided to digital-to-analogue converter (DAC) circuitry 312, which converts the summed digital signal to the analogue domain. Those skilled in the art will be familiar with many different processes and circuits which can perform this DAC function, and the DAC circuitry 312 is not described further herein.

The output of the DAC circuitry 312 (which is an analogue audio signal) is provided to a power amplifier 314. The power amplifier 314 applies an analogue gain to the signal, and outputs an amplified analogue signal to an output 316. The analogue gain is typically an attenuation of the signal. As noted above, the amplified analogue signal may be provided to an audio transducer, either within the same electronic device as the apparatus 300, or coupled to that device.

Thus first and second digital gains are applied to SignalA and SignalB, before the signals are combined and converted to the analogue domain. An analogue gain is applied to the analogue signal, which is then output from the apparatus 300. Those skilled in the art will appreciate that alternative circuitry may be provided which achieves substantially the same effect. For example, both FIGS. 2 and 3 show the application of digital gain to the first and second digital audio signals, and the combination of those digital signals prior to conversion to the analogue domain (in the control circuitry 234 or the combining element 310). However, it will be apparent that the digital signals may be converted to the analogue domain separately, and then combined, without altering the operation of the circuitry significantly and without departing from the scope of the claims appended hereto.

In order to determine the first and second digital gains, and the analogue gain, which are to be applied to the various signals in the apparatus 300, the apparatus comprises control circuitry operable to provide control signals to the first and second digital gain elements 304, 308 and the power amplifier 314 to control and set the gains to be applied in those elements.

The control circuitry comprises a further digital gain element 318, which is coupled to the output of the upsampler 302 to receive the upsampled version of SignalA. The digital gain element 318 applies a gain to the signal which is based on the volume parameter VolumeA.

As described above, the gain applied in the digital gain element 318 is typically a linear value, and therefore VolumeA may have first been converted from dB to a linear value. Again, the gain factor applied in the digital gain element 318 may further be adapted by a softramp control module 320. The softramp control module 320 may adapt the volume parameter VolumeA (which may be received from the AP 110, see above) so as to smooth transitions between different values of the volume parameter and avoid unwanted audio artefacts caused by any abrupt change in the volume.

Similarly, the control circuitry comprises another digital gain element 322, coupled to the output of the upsampler 306 to receive the upsampled version of SignalB. The digital gain element 322 applies a gain to the signal which is based on the volume parameter VolumeB (which may also be provided from the AP 110 or accessible in a register). Again, the volume parameter VolumeB may be further adapted by a softramp control module 324, similar to the module 320.

The outputs of the gain elements 318, 322 are provided to a combining element 326, which sums them and provides the summed output to DRE circuitry 328. Thus, the DRE circuitry 328 receives a signal which is equal to (SignalA*VolumeA+SignalB*VolumeB), wherein the operator * relates to application of a gain (i.e. defined in terms of decibels) rather than direct multiplication of two quantities, as noted above. For example, if SignalA and SignalB are both equal to 1, VolumeA is equal to −6 dB and VolumeB is equal to −9 dB, the DRE circuitry 328 receives a signal which is approximately equal to 0.5+0.35=0.85.

The DRE circuitry 328 determines an analogue gain parameter AVOL to the power amplifier 314, which is based on a combination of SignalA and SignalB or signals derived therefrom. In one embodiment, the analogue gain may be set to (SignalA*VolumeA+SignalB*VolumeB), i.e. the output of the combining element 326. However, as noted above, this configuration may lead to unwanted raised noise levels when the input signals are at or close to full scale.

Figure 4:
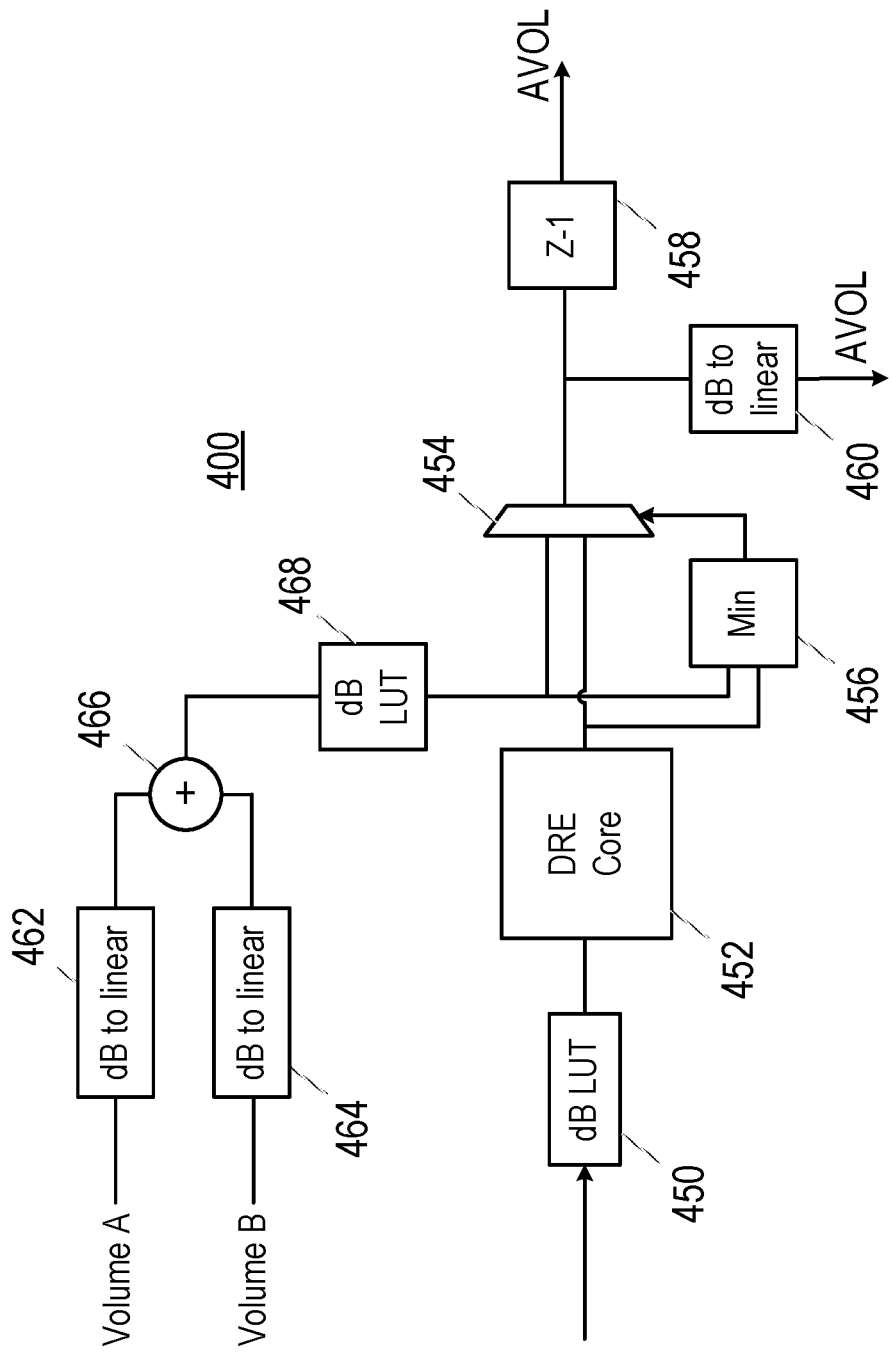
FIG. 4 shows DRE circuitry according to embodiments of the disclosure.

FIG. 4 thus shows DRE circuitry 400 according to embodiments of the disclosure, for controlling amplification and applying dynamic range extension to combinations of multiple input audio signals. The DRE circuitry 400 may thus perform the functions of the DRE circuitry 328 shown in FIG. 3.

The DRE circuitry 400 comprises converter circuitry 450 for converting the linear output of the digital gain element 318 to dB. In the illustrated embodiment, the converter circuitry comprises a look-up table (LUT) between the linear values and corresponding dB values, but those skilled in the art will be well aware of alternative conversion mechanisms and the present disclosure is not limited in that regard.

The output of the converter circuitry is provided to a DRE core module 452, which performs one or more functions based on the output of the converter circuitry, and outputs an analogue gain parameter. For example, the DRE core module 452 may apply one or more filters to the output of the converter circuitry 450 so as to condition the signal to achieve a desired effect. The filters may comprise a low-pass filter, designed to smooth the signal by filtering out high-frequency components, for example. The DRE core module 452 may additionally or alternatively detect an envelope of the output of the converter circuitry 450, SignalA*VolumeA+SignalB*VolumeB, and output the envelope as the analogue gain parameter. The output of the DRE core module 452 (whether corresponding to the filtered output of the converter circuitry 450 and/or the envelope of that output) may be subject to one or more additional operations, such as the addition of an offset to provide a fixed amount of padding or headroom to account for any underestimation in the output.

According to embodiments of the disclosure the DRE circuitry 400 additionally comprises limiter circuitry configured to limit the analogue gain parameter to whichever is smaller of the output of the DRE core module 452 (e.g., SignalA*VolumeA+SignalB*VolumeB) and the summation of the path gains in the first and second signal paths (e.g., VolumeA+VolumeB). In this way, the analogue gain maintains an optimal noise floor for full-scale input signals and preventing underestimation of the input signal at all amplitudes.

In the illustrated embodiment, the limiter circuitry comprises a first dB to linear converter 462 which is configured to receive as input the path gain from softramp control circuitry 320 (e.g., VolumeA), and to convert that signal from dB to the linear domain. Of course, the conversion to the linear domain may alternatively take place outside the DRE core module 400. The DRE circuitry 400 further comprises a second dB to linear converter 464 which is configured to receive as input the path gain from softramp control circuitry 324 (e.g., VolumeB), and to convert that signal from dB to the linear domain. Again, the conversion to the linear domain may alternatively take place outside the DRE core module 400. The two linear numbers are then summed in a summing element 466, and converted back to decibels in converter circuitry 468 (which may be a dB LUT, similar to circuitry 450, or a different mechanism).

The limiter circuitry further comprises a selector module 454 which is configured to receive as inputs the output of the DRE core module 452 (e.g., SignalA*VolumeA+SignalB*VolumeB) and the output of the converter circuitry 468 (e.g., VolumeA+VolumeB). These signals are further provided to a minimum detection module 456, which is configured to determine which is smaller. The minimum detection module 456 outputs a control signal to the selector module 454, indicative of the smaller signal, and the selector module 454 is then operative to output the smaller signal as the analogue gain parameter.

The analogue gain parameter (AVOL) is provided to the power amplifier 314 for application as the analogue gain to the output of the DAC circuitry 312. The analogue gain parameter may be subject to a delay (e.g., in a delay unit 458 as shown in FIG. 4), to account for delay in the DAC circuitry 312, such that a particular value of the analogue gain is applied to a signal on the digital components of which the analogue gain was determined.

The analogue gain parameter is also provided to first and second combining elements 330, 332 to be used in determining the first and second digital gains to be applied in the first and second digital gain elements 304, 308. The analogue gain AVOL so provided may not be subject to the same delay applied to the analogue gain AVOL provided to the power amplifier 314, as the digital gains are applied prior to the processing in DAC circuitry 312.

Further, the analogue gain parameter is linear in some embodiments. When provided to the combining elements 330, 332, however, the quantity may be converted back to a logarithmic equivalent (i.e. dBs) in dB-to-linear convertor circuitry 460.

One combining element 330 receives the volume parameter VolumeA (or the output of the softramp control module 320), the analogue gain from DRE circuitry 328, and outputs a signal equal to the difference, e.g., VolumeA−AVOL. The other combining element 332 receives the volume parameter VolumeB (or the output of the softramp control module 324), the analogue gain from DRE circuitry 328, and outputs a signal equal to the difference, e.g., VolumeB−AVOL. So, for example, if VolumeA is −6 dB, and AVOL is −1 dB, then the digital gain factor applied in combining element 330 is −5 dB. Similarly, if VolumeB is −9 dB, and AVOL is −1 dB, then the digital gain factor applied in combining element 332 is −8 dB.

The outputs of the combining elements 330, 332 are the digital gain factors to be applied to SignalA and SignalB. Thus, the output of combining element 330 is provided to digital gain element 304, and a digital gain factor equal to VolumeA−AVOL is applied to SignalA. The output of combining element 332 is provided to digital gain element 308, and a digital gain factor equal to VolumeB−AVOL is applied to SignalB.

It will be noted that the analogue gain applied in the power amplifier 314 (i.e. to the combination of audio signals) is thus effectively compensated for by corresponding alterations in the digital gains applied to each signal individually. The net effect of this circuitry is that SignalA is preserved when it is the sole audio signal, maximizing the dynamic range of the amplifier 314 using an analogue volume. When SignalB is added (such as a system sound), the dynamic range of SignalA is traded off via digital attenuation. The changes in digital and analogue gain factors may be closely correlated to ensure that audible artefacts arising from the dynamically changing gain factors are reduced or eliminated entirely. Further, by limiting the analogue gain to the minimum of the summation of the volume parameters and the output of the combining element 326, an optimal noise floor is maintained for full-scale input signals without causing underestimation of the input signals at other amplitudes.

Figure 5:
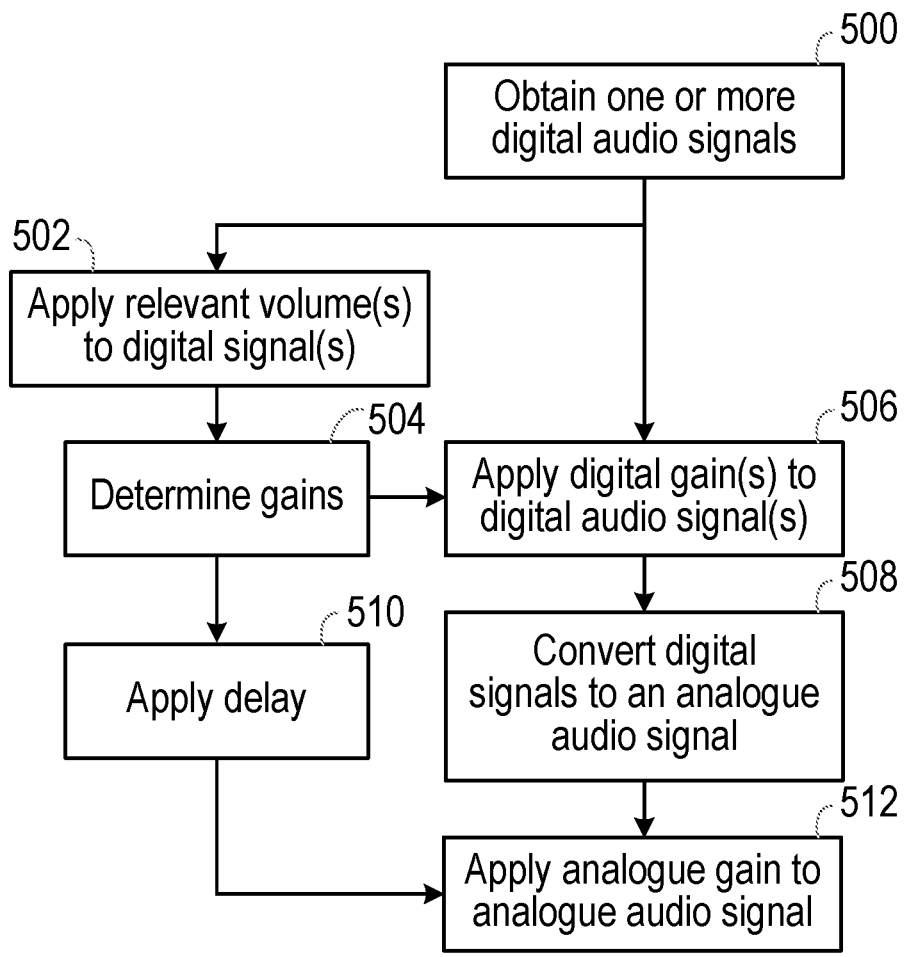
FIG. 5 is a flowchart of a method according to embodiments of the disclosure.

FIG. 5 is a flowchart of a method according to embodiments of the disclosure. The method may be carried out in a codec, such as the codec 130 or either apparatus 200 or 300 described above.

The method begins in step 500, in which one or more digital audio input signals are obtained. The signals may be generated within the codec or provided to the codec from another device. According to the method, the one or more digital audio input signals are subject to digital gains, and their combination (in the analogue domain) is subject to an analogue gain. Thus, the method comprises a process of determining the appropriate gains and a process of applying those gains, which processes may be conducted in parallel.

One or more of the digital audio input signals may be associated with volume parameters, also provided to the codec or accessible by the codec. In step 502, in order to determine the appropriate gains, the relevant volume parameters are applied to the digital audio input signals as digital gain factors. If no volume parameter is defined for a particular digital audio input signal, no gain factor is applied in this step.

In step 504, one or more digital gains and an analogue gain are determined based on the output of step 502. For example, the analogue gain may be determined based on a comparison of the volume parameters to the signal(s) output from step 502. The analogue gain may be determined as whichever is smaller of: a summation of the one or more volume parameters; and a combination of the one or more digital audio input signals as multiplied by the respective volume parameters (the combination may be a summation, for example).

Where a plurality of volume parameters are received as part of the method, the analogue gain may be determined based on a comparison of the summation of the plurality of volume parameters (e.g., in the linear domain) and the one or more digital audio input signals as multiplied by the volume parameters. If more than one digital audio input signal is received in step 500 (e.g., first and second digital audio input signals), the analogue gain may be determined based on a comparison of the summation of the volume parameters and a combination of the first and second digital audio input signals as multiplied by the volume parameters. The combination may comprise a summation of the first and second digital audio input signals as multiplied by the volume parameters.

The digital gain for a digital audio input signal may be determined as a difference between the volume associated with the digital audio input signal and the analogue gain.

In step 506, the digital gains are applied to the one or more digital audio input signals. For example, where only a single digital audio input signal is obtained, a single digital gain is applied to that signal; where more than one digital audio input signal is obtained, respective digital gains may be applied to those signals.

In step 508, the one or more digital audio input signals, after application of the digital gains, are converted to the analogue domain in a single analogue signal. For example, where step 500 comprises obtaining first and second digital audio input signals, after application of the digital gain(s), the first and second digital audio input signals may be combined into a combined digital signal before conversion to a corresponding analogue signal. Alternatively, the first and second digital audio input signals may each be converted to respective analogue signals before being combined. Where step 500 comprises obtaining a single digital audio input signal, that digital signal may be converted directly to a corresponding analogue signal after application of the digital gain.

In step 512, the analogue gain determined in step 504 is applied to the combined analogue signal, for example in a power amplifier. The conversion in step 508 may introduce some delay to the signals, and therefore the analogue gain may also be delayed by a corresponding amount in step 510, to ensure that the correct gain is applied to the correct signal.

The present disclosure thus provides methods, apparatus and systems for the output of an audio signal to an audio transducer. In particular, the concepts disclosed herein utilize dynamic range enhancement techniques to improve or maximize the dynamic range of an audio signal, while ensuring that the noise floor is not raised for full-scale input signals.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An apparatus for providing an output signal to an audio transducer, comprising:
   one or more signal paths for receiving respective digital audio input signals, applying respective digital gains, and outputting respective amplified digital audio input signals;
   one or more inputs, each input for receiving a volume parameter associated with a respective one of the one or more digital audio input signals;
   converter circuitry for converting the one or more amplified digital audio input signals into an analogue audio input signal;
   an analogue gain element, for applying an analogue gain to the analogue audio input signal to generate the output signal; and
   a control circuit, coupled to the one or more signal paths, operative to select the analogue gain based on a comparison of the respective volume parameters to the respective digital audio input signals as multiplied by the respective volume parameters, and to select the respective digital gains for each digital audio input signal so that an overall gain in each respective signal path corresponds to a volume parameter associated with the respective digital audio input signal.

2. The apparatus according to claim 1, wherein the control circuit is operative to select as the analogue gain whichever is smaller of: a summation of the one or more volume parameters; and a combination of the one or more digital audio input signals as multiplied by the respective volume parameters.

3. The apparatus according to claim 2, wherein the one or more volume parameters are summed in a linear domain.

4. The apparatus according to claim 2, wherein the one or more inputs receive a single volume parameter.

5. The apparatus according to claim 2, wherein the combination comprises a summation of the one or more digital audio input signals as multiplied by the volume parameters.

6. The apparatus according to claim 1, wherein the apparatus comprises first and second signal paths for receiving respective first and second digital audio input signals, and wherein the control circuit is operative to select the analogue gain based on a comparison of the summation of the one or more volume parameters and a combination of the first and second digital audio input signals as multiplied by the volume parameters.

7. The apparatus according to claim 6, wherein the second digital audio input signal is intermittent, such that the analogue gain and a first digital gain applied to the first digital audio input signal are selected so as to compensate for the presence and absence of the second digital audio input signal.

8. The apparatus according to claim 1, wherein the analogue gain is configured with a delay to compensate for delay caused by the converter circuitry.

9. The apparatus according to claim 1, wherein at least one of the one or more digital audio input signals is a full-amplitude signal.

10. The apparatus according to claim 1, wherein the analogue gain is selected such that a bit width of a combination of at least the amplified digital audio input signals matches a capacity of the converter circuitry.

11. The apparatus according to claim 1, wherein the apparatus is provided on a single integrated circuit.

12. An electronic device comprising:
an apparatus as claimed in claim 1.

13. The electronic device according to claim 12, further comprising processor circuitry, configured to provide to the apparatus one or more of: the one or more digital audio input signals; and the one or more volume parameters.

14. The electronic device according to claim 12, wherein the electronic device is at least one of: a portable device; a battery powered device; a communications device; a computing device; a mobile telephone; a laptop, notebook or tablet computer; a personal media player; a gaming device; and a wearable device.

15. A method for providing an output signal to an audio transducer, comprising:
receiving one or more digital audio input signals, applying respective digital gains, and outputting respective amplified digital audio input signals;
receiving one or more volume parameters, each volume parameter associated with a respective one of the digital audio input signals;
converting the one or more amplified digital audio input signals into an analogue audio input signal; and
applying an analogue gain to the analogue audio input signal to generate the output signal,
wherein the analogue gain is determined based on a comparison of the respective volume parameters to the respective digital audio input signals as multiplied by the respective volume parameters, and wherein the respective digital gains for each digital audio input signal are determined so that an overall gain in each respective signal path corresponds to a volume parameter associated with the respective digital audio input signal.

16. The method according to claim 15, wherein the analogue gain is determined as whichever is smaller of: a summation of the one or more volume parameters; and a combination of the one or more digital audio input signals as multiplied by the respective volume parameters.

17. The method according to claim 16, wherein the one or more volume parameters are summed in a linear domain.

18. The method according to claim 15, wherein first and second digital audio input signals are received, and wherein the analogue gain is determined based on a comparison of the summation of the one or more volume parameters and a combination of the first and second digital audio input signals as multiplied by the volume parameters.

19. The method according to claim 18, wherein the combination comprises a summation of the first and second digital audio input signals as multiplied by the volume parameters.

20. The method according to claim 18, wherein the second digital audio input signal is intermittent, such that the analogue gain and a first digital gain applied to the first digital audio input signal are selected so as to compensate for the presence and absence of the second digital audio input signal.

* * * * *

UNITED STATES PATENT AND TRADEMARK OFFICE
CERTIFICATE OF CORRECTION

PATENT NO. : 11,528,002 B2
APPLICATION NO. : 17/349638
DATED : December 13, 2022
INVENTOR(S) : Prior et al.

Page 1 of 1

It is certified that error appears in the above-identified patent and that said Letters Patent is hereby corrected as shown below:

In the Specification

1. In Column 5, Line 15, delete "digital audio signal 112" and insert -- audio file 112 --, therefor.

2. In Column 8, Line 4, delete "250" and insert -- 260 --, therefor.

3. In Column 8, Lines 20-21, delete "softramp control module" and insert -- softramp volume control module --, therefor.

4. In Column 8, Line 25, delete "softramp control module" and insert -- softramp volume control module --, therefor.

5. In Column 10, Line 14, delete "AP 210" and insert -- AP 110 --, therefor.

6. In Column 10, Line 14, delete "codec 230" and insert -- codec 130 --, therefor.

7. In Column 12, Line 36, delete "module 400" and insert -- module 452 --, therefor.

8. In Column 12, Line 42, delete "module 400" and insert -- module 452 --, therefor.

Signed and Sealed this
Twenty-seventh Day of August, 2024

Katherine Kelly Vidal
*Director of the United States Patent and Trademark Office*